US010178813B2

(12) United States Patent
Boteler et al.

(10) Patent No.: US 10,178,813 B2
(45) Date of Patent: Jan. 8, 2019

(54) STACKED POWER MODULE WITH INTEGRATED THERMAL MANAGEMENT

(71) Applicant: U.S. Army Research Laboratory ATTN: RDRL-LOC-I, Adelphi, MD (US)

(72) Inventors: Lauren M. Boteler, Highland, MD (US); Damian P. Urciuoli, Bowie, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/416,495

(22) Filed: Jan. 26, 2017

(65) Prior Publication Data
US 2018/0213676 A1   Jul. 26, 2018

(51) Int. Cl.
*H05K 7/20* (2006.01)
*H02M 3/158* (2006.01)

(52) U.S. Cl.
CPC .......... *H05K 7/2089* (2013.01); *H02M 3/158* (2013.01); *H05K 7/209* (2013.01)

(58) Field of Classification Search
CPC .......... H05K 7/2089–7/20945; H01L 23/4012; H02M 3/158
See application file for complete search history.

(56) References Cited

U.S. PATENT DOCUMENTS 4,944,344 A * 7/1990 Crowe ................ F28D 15/0233
165/104.11
5,532,512 A * 7/1996 Fillion ................. H01L 25/071
257/686

(Continued)

FOREIGN PATENT DOCUMENTS

EP    2546874    1/2013

OTHER PUBLICATIONS

"DirectFET—A Proprietary New Source Mounted Power Package for Board Mounted Power" (PCIM 2001), Andrew Sawle, Martin Standing, Tim Sammon, Arthur Woodworth, International Rectifier, Oxted, Surrey. England.

(Continued)

*Primary Examiner* — David M Sinclair
*Assistant Examiner* — Robert D Brown
(74) *Attorney, Agent, or Firm* — Eric Brett Compton

(57) ABSTRACT

A power module including a plurality of power die layers including power electronic components; a plurality of heat sink components operatively connected to multiple sides of each power electronic component; a plurality of electrically conductive layers contacting the plurality of heat sink components, wherein a power die layer and an electrically conductive layer sequentially alternate to form a stacked structure such that both ends of the stacked structure includes an end electrically conductive layer. A cooling path is integrated with each layer in the stacked structure. A housing unit houses the stacked structure. The power electronic components may include heat-producing electronic devices. The cooling path may accommodate any of a fluid and solid to liquid phase change materials. The fluid comes into direct contact with the power die layers, heat sink components, and electrically conductive layers.

19 Claims, 13 Drawing Sheets

(56) References Cited

U.S. PATENT DOCUMENTS

| | | | |
|---|---|---|---|
| 6,014,313 A * | 1/2000 | Hesselbom | H01L 25/0652 174/16.3 |
| 6,031,279 A | 2/2000 | Lenz | |
| 6,306,680 B1 | 10/2001 | Fillion et al. | |
| 8,279,605 B2 * | 10/2012 | Kawanami | H01L 23/642 361/704 |
| 8,358,000 B2 * | 1/2013 | Beaupre | H01L 23/3735 257/691 |
| 2004/0089934 A1 * | 5/2004 | Shimoida | H01L 25/071 257/686 |
| 2004/0164432 A1 * | 8/2004 | Hsu | H01L 23/44 257/786 |
| 2005/0167801 A1 * | 8/2005 | Kerr | H01L 23/3677 257/678 |
| 2005/0208750 A1 * | 9/2005 | Hsu | H01L 25/07 438/614 |
| 2006/0289147 A1 * | 12/2006 | Zuo | F28D 15/0266 165/104.26 |
| 2010/0308421 A1 * | 12/2010 | Muto | H01L 25/074 257/401 |
| 2011/0038122 A1 * | 2/2011 | Ahangar | H01L 23/4275 361/700 |
| 2011/0227207 A1 * | 9/2011 | Yilmaz | H01L 23/49524 257/676 |
| 2012/0299119 A1 * | 11/2012 | Xue | H01L 23/49524 257/401 |
| 2013/0015495 A1 * | 1/2013 | Hauenstein | H01L 25/071 257/140 |
| 2013/0020694 A1 * | 1/2013 | Liang | H01L 25/072 257/691 |
| 2014/0327127 A1 * | 11/2014 | Hable | H01L 21/50 257/712 |
| 2015/0208550 A1 * | 7/2015 | Rugg | H05K 7/20518 361/713 |
| 2015/0289410 A1 * | 10/2015 | Salat | H01L 23/473 361/699 |
| 2016/0286687 A1 * | 9/2016 | Tajima | H05K 7/2049 |
| 2016/0329264 A1 * | 11/2016 | Ekwall | H01L 23/4006 |
| 2016/0358838 A1 * | 12/2016 | Basler | H01L 24/48 |
| 2017/0047268 A1 * | 2/2017 | Terasaki | H01L 25/07 |
| 2018/0040537 A1 * | 2/2018 | Grassmann | H01L 23/473 |

OTHER PUBLICATIONS

Charlotte Gillot, et al., "Double-Sided Cooling for High Power IGBT Modules Using Flip Chip Technology," IEEE Transactions on Components and Packaging Technologies, vol. 24, No. 4, pp. 698-704, Dec. 2001.

A slide of a presentation made at a meeting at the Jet Propulsion Laboratory (JPL) on May 5, 2016.

Poster titled "Power Electronics Packaging: An Approach with Stacked Die and Integrated Cooling," displayed at the 10th annual Summer Student Symposium at the Adelphi Laboratory Center in Maryland, Aug. 11, 2016.

* cited by examiner

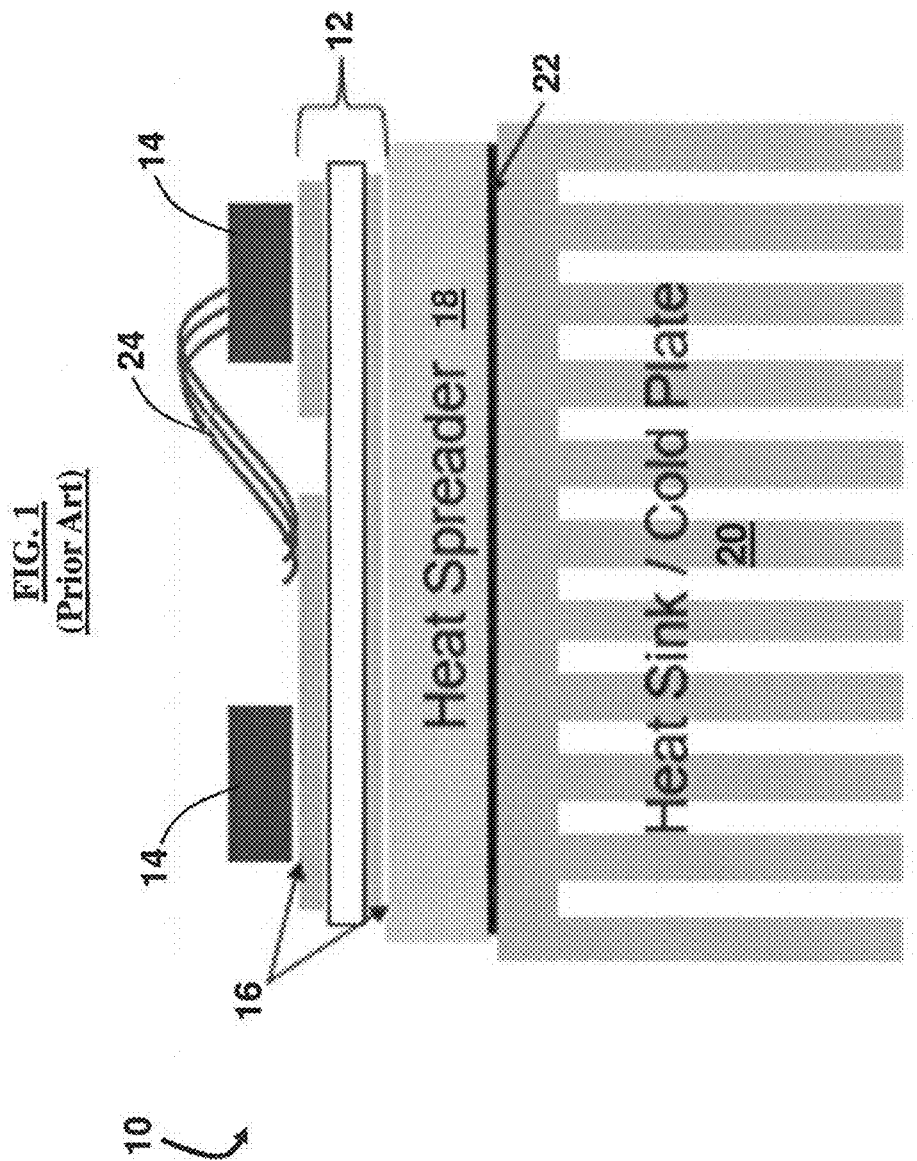

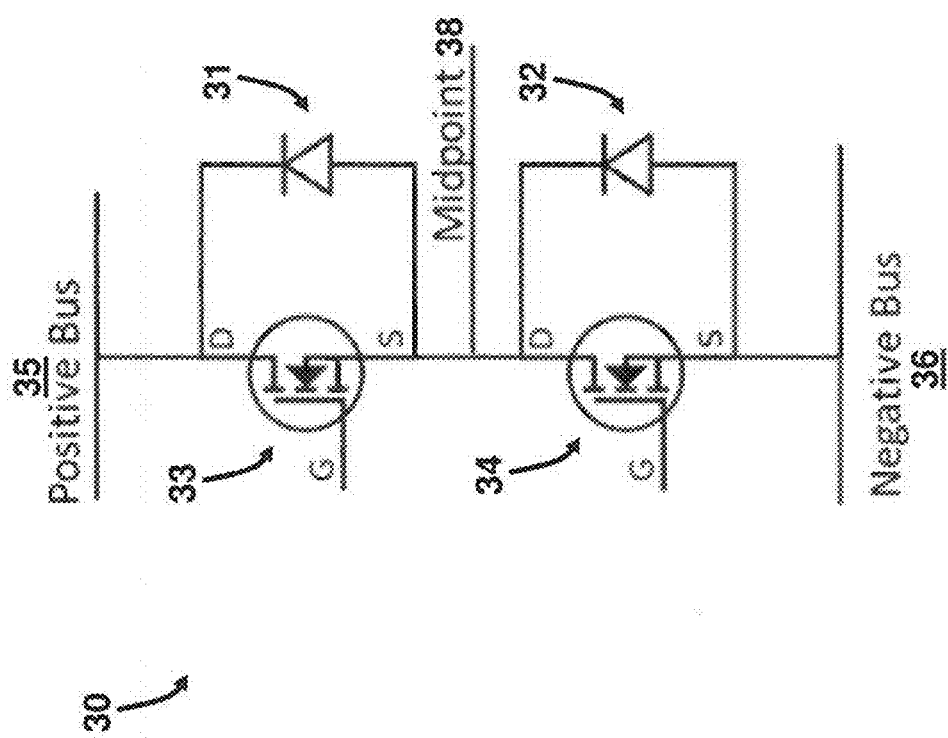

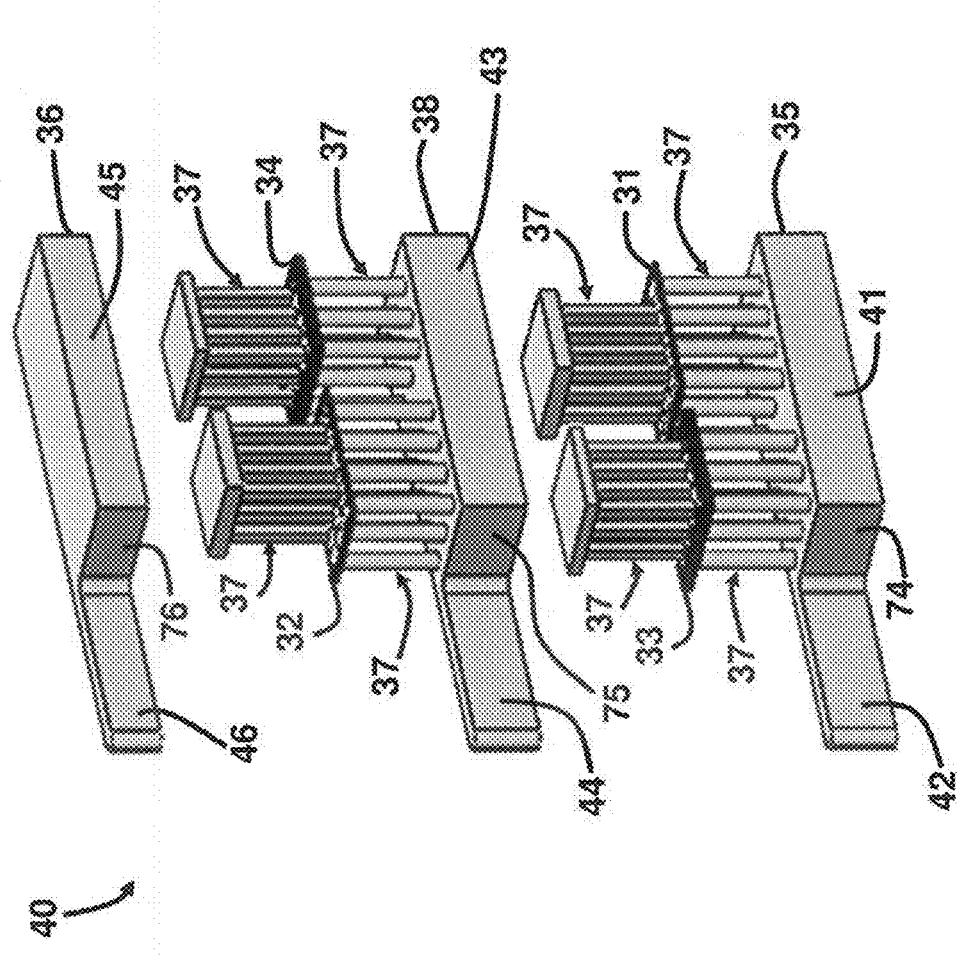

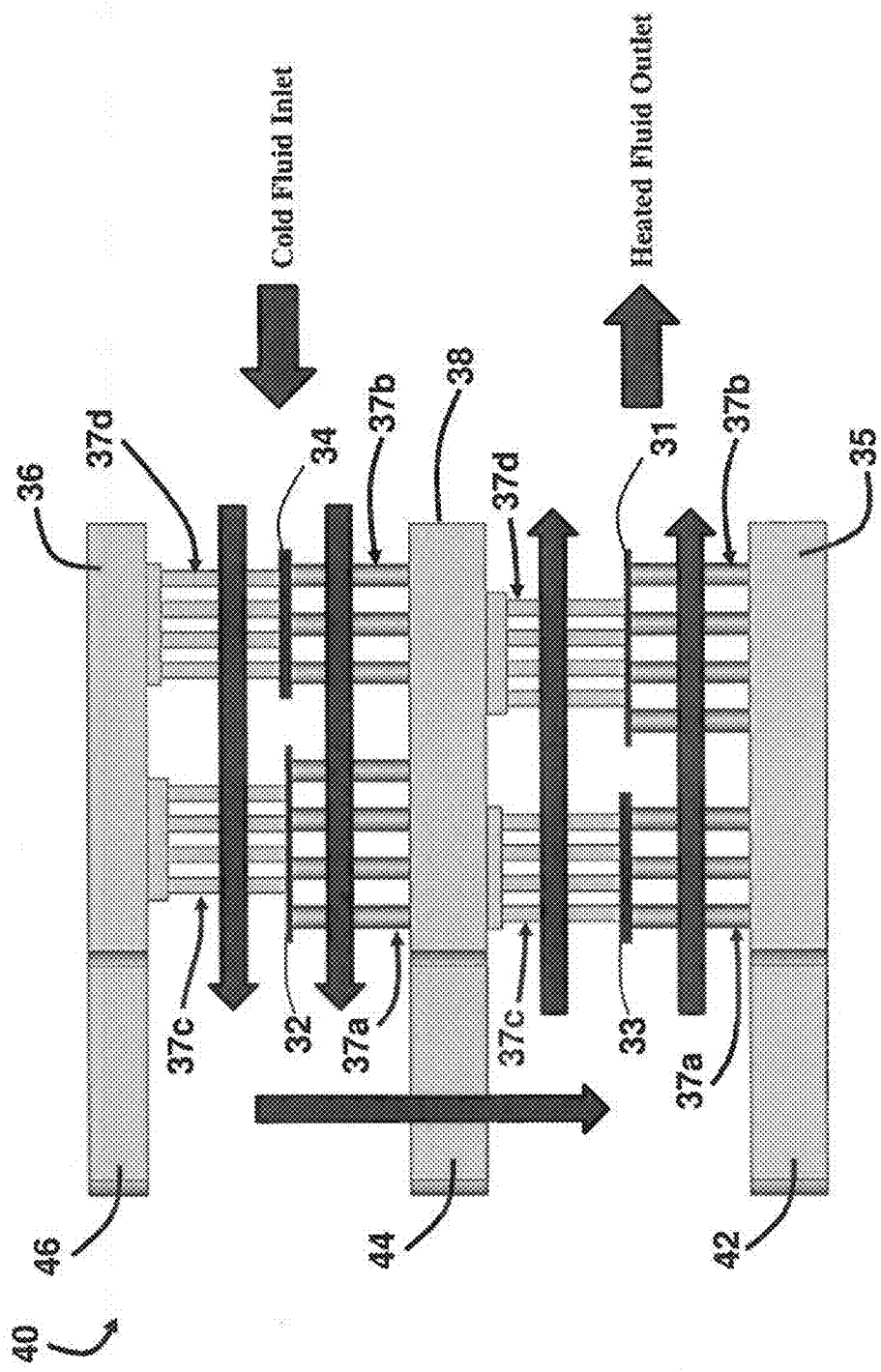

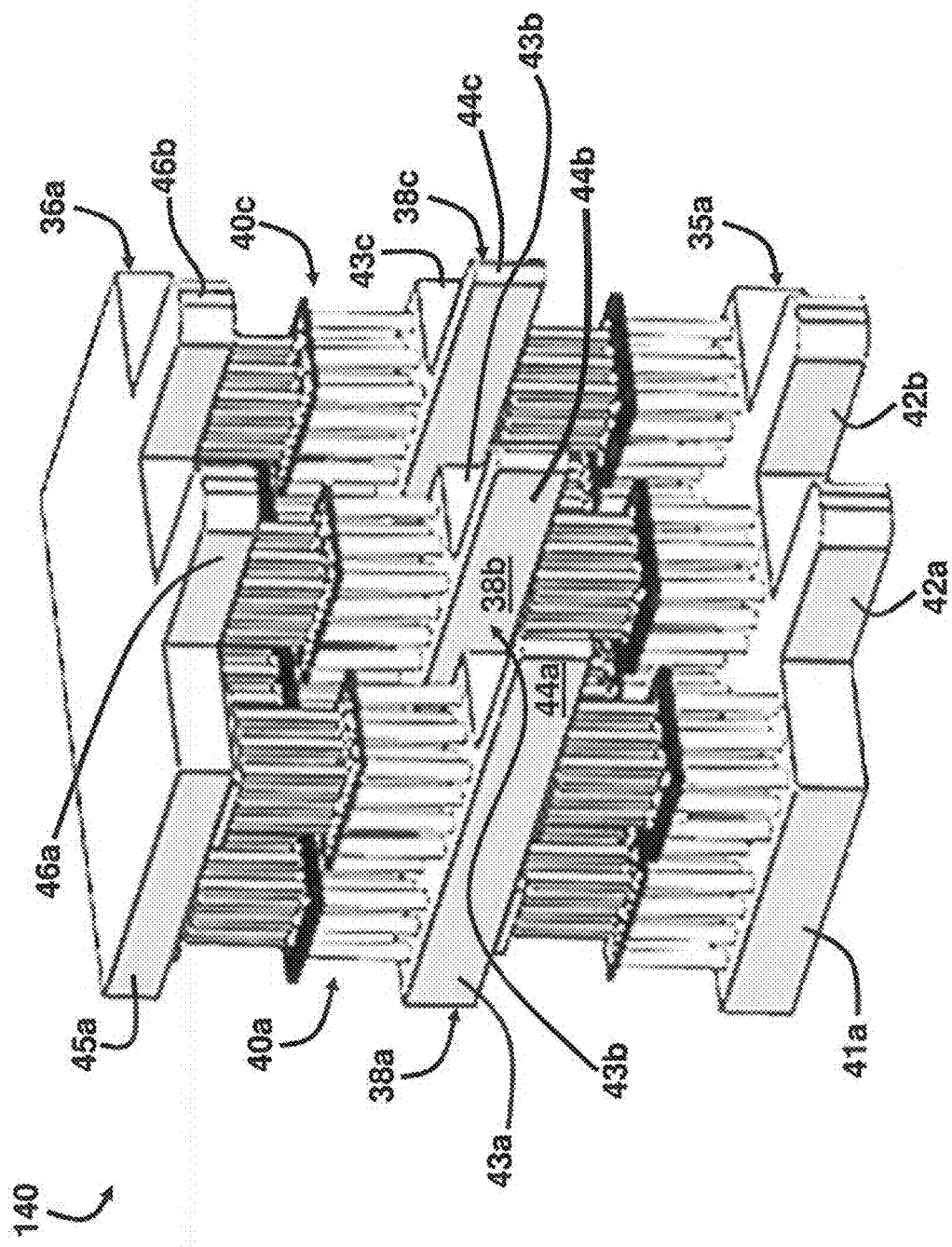

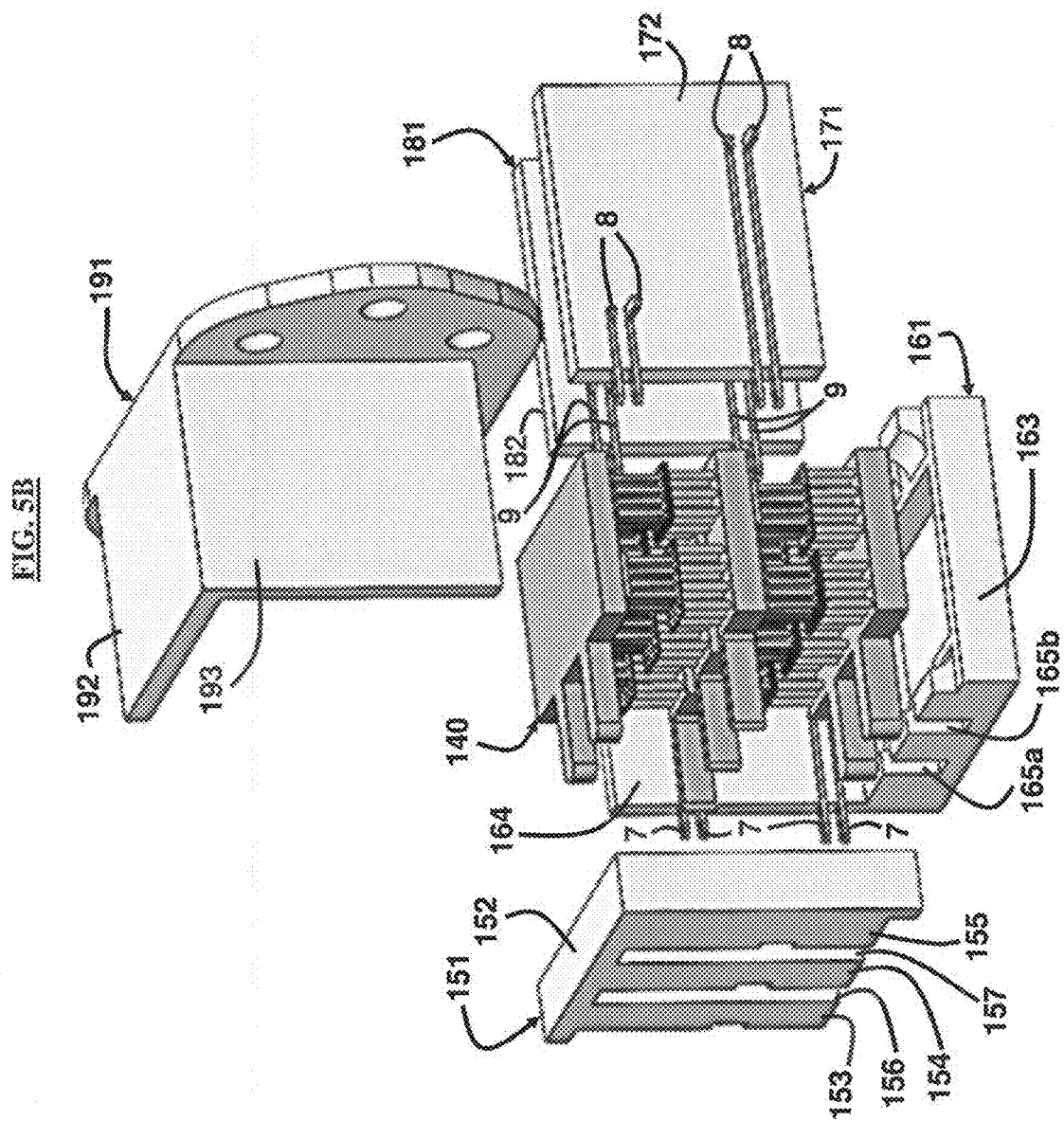

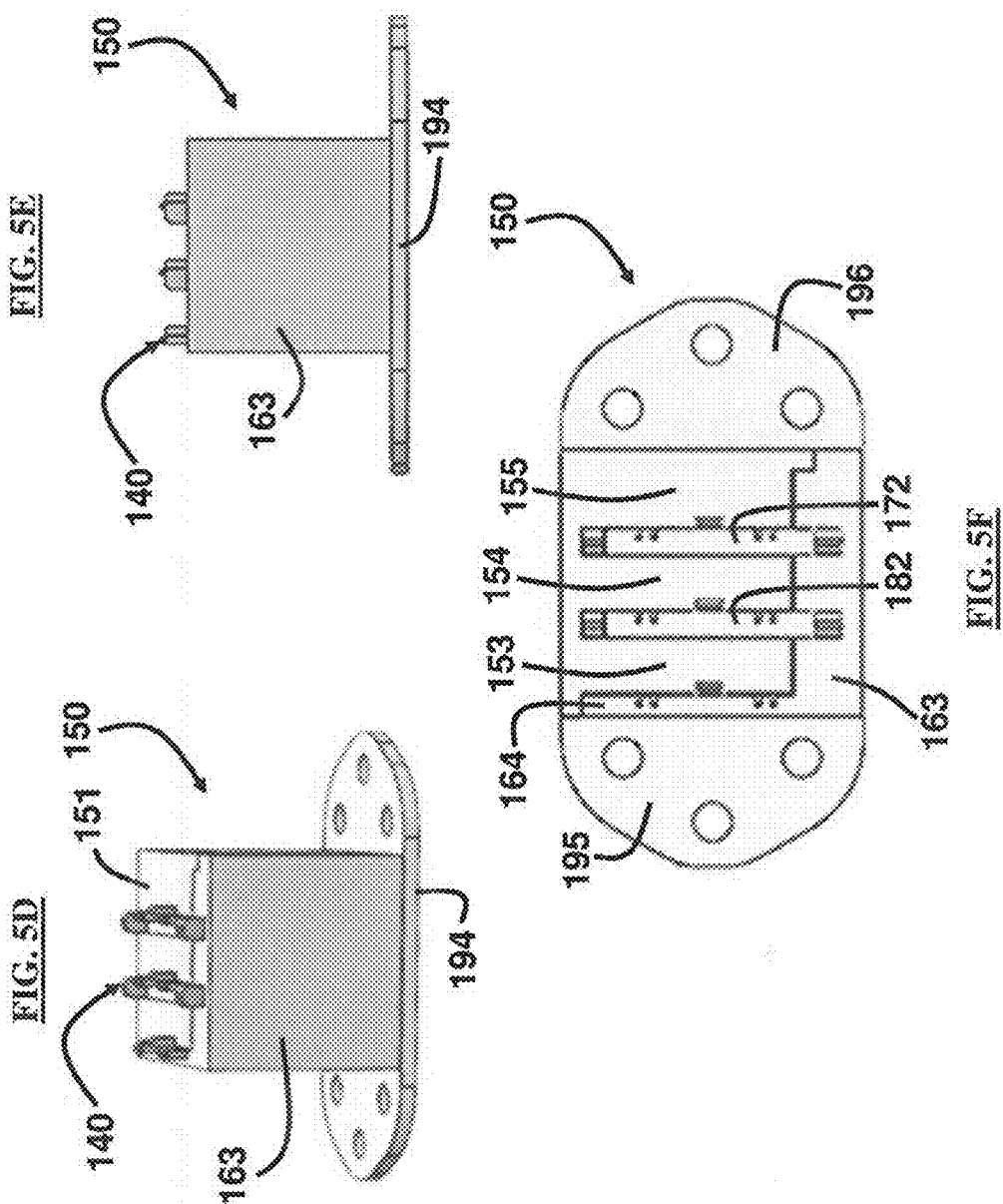

STACKED POWER MODULE WITH INTEGRATED THERMAL MANAGEMENT

GOVERNMENT INTEREST

The embodiments herein may be manufactured, used, and/or licensed by or for the United States Government without the payment of royalties thereon.

BACKGROUND

Technical Field

The embodiments herein generally relate to power electronics, and more particularly to a power module packages.

Description of the Related Art

There is a trend in power electronics towards more power in smaller packages which leads to significantly higher power densities and the need to remove more heat. The devices can handle the high currents and voltages but must often be derated due to the limitations of the packaging. Current power electronics modules are large and heavy, most of which is the packaging. There are three primary challenges associated with current power modules: heat removal, reliability, and parasitic inductance. Most research to date has explored options of improving only one of these challenges by methods such as eliminating wirebonds or incorporating a better heat sink.

A conventional power package 10 is shown in FIG. 1 and contains a direct bond copper (DBC) substrate 12 that has chips 14 soldered 16 to one side and a heat spreader 18 and/or heat sink 20 attached to the other. A thermal material interface (TIM) 22 separates the heat spreader 18 from the heat sink 20. Wirebonds 24 are then used to make the electrical connections.

Thermal management is crucial in high power electronics due to the extremely large amount of heat that is dissipated by the devices. The amount of power that a module can achieve is most often temperature limited; therefore, if the heat can more effectively be removed, the module can operate at a higher power density. In addition, most reliability concerns are strongly temperature dependent; therefore, reducing device temperature will improve reliability.

Parasitic inductance is typically caused by the packaging; primarily wirebonds and planar packaging topologies. This parasitic inductance in combination with higher currents and faster switching speeds, results in voltage overshoot and ringing during switching, as is seen in the following equation:

$$V = L \, di/dt$$

These voltage spikes and ringing lead to the necessity for devices to be derated up to 50%. Additionally, inductance causes signal delays which cause the devices to turn on differently, thus affecting the performance of the system and decreasing the reliability. The current practice for reducing inductance is to add a snubber to the system to clamp the peak voltage but snubbers are power dissipative and often require their own cooling system in addition to adding complexity to the system and increasing its size.

SUMMARY

In view of the foregoing, an embodiment herein provides a power module comprising a power module, wherein the power module comprises a stack of power electronic components arranged in layers; an electrically conductive material separating each layer from one another; a heat sink operatively connected to multiple sides of each power electronic component in the stack; and a cooling path integrated with each layer in the stack. The power electronic components comprise a plurality of diodes. The power electronic components comprise a plurality of switching devices. The cooling path may accommodate any of a fluid and solid to liquid phase change materials. The power module may further comprise electrically conductive layers positioned on opposite ends of the stack, wherein the electrically conductive layers comprise a first end electrically conductive layer and a second end electrically conductive layer. The first side may face towards the first end electrically conductive layer, and the second side may face towards the second end electrically conductive layer, wherein the first end and second electrically conductive layers may comprise busbars. Each power electronic component may comprise a first side and an oppositely positioned second side. The heat sink may comprise at least one pillar structure extending from each of the first side and the second side of each power electronic component. The power module may further comprise a housing unit that houses the power module. The electrically conductive material may be configured as a structured layer comprising a base portion and an external electrical contact extending from the base portion. The housing unit may comprise a plurality of holes aligned with the cooling path to create an inlet and outlet for a cooling fluid to traverse along the cooling path. The power module may further comprise a housing unit that houses the power module, wherein the housing unit may comprise a plurality of electrical contacts that operatively connect to the plurality of switching devices. The power module may further comprise multiple power modules adjacent to one another. The stack of power electronic components arranged in layers may comprise a half-bridge configuration. The first end electrically conductive layer and the second end electrically conductive layer may comprise copper. The fluid comes into direct contact with the power electronic components.

Another embodiment provides a power module comprising a plurality of power die layers comprising power electronic components; a plurality of heat sink components operatively connected to multiple sides of each power electronic component; a plurality of electrically conductive layers contacting the plurality of heat sink components, wherein a power die layer and an electrically conductive layer sequentially alternate to form a stacked structure such that both ends of the stacked structure comprises an end electrically conductive layer; a cooling path integrated with each layer in the stacked structure; and a housing unit that houses the stacked structure. The power electronic components may comprise heat-producing electronic devices. The cooling path may accommodate any of a fluid and solid to liquid phase change materials. The fluid comes into direct contact with the plurality of power die layers, the plurality of heat sink components, and the plurality of electrically conductive layers.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1 is a schematic diagram of a conventional power package;

FIG. 2A is a circuit diagram of a half-bridge inverter showing connections between two switch devices and two diodes according to an embodiment herein;

FIG. 3A is a perspective view of the power package module of FIGS. 2A and 2B according to an embodiment herein;

FIG. 4 is a cross-sectional diagram of a power package module in a stacked configuration showing how fluid passes over the devices according to an embodiment herein;

FIG. 5A is a schematic diagram of a power package module in a 3-phase inverter configuration showing a stacked configuration of twelve devices according to an embodiment herein;

FIG. 5B is a schematic diagram of the power package module of FIG. 5A configured in a housing unit according to an embodiment herein;

FIGS. 5D through 5F are schematic diagrams of the power package module of FIG. 5A fully configured in a housing unit according to an embodiment herein.

DETAILED DESCRIPTION

Figure 2B:
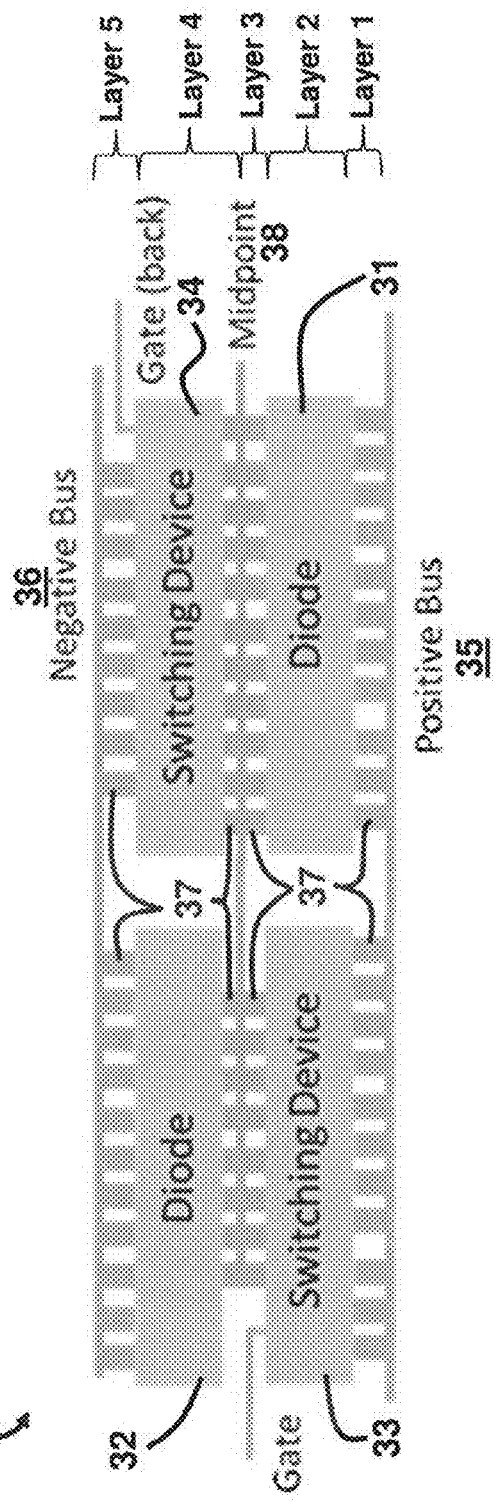
FIG. 2B is a schematic diagram of a power package containing the half-bridge inverter of FIG. 2A showing the different layers and connections to various devices according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a technique for power electronics packaging, which stacks power devices with integrated cooling. In one exemplary embodiment, the structure comprises at least a five-layer stack (metal, power die, metal, power die, metal) with the metallic layers acting as thermal, structural, and electrical contacts between the power die. The power module configuration significantly reduces power module packaging size, weight, and cost while improving reliability and performance. The embodiments herein stack power devices and include an integrated heat sink. It also eliminates the solid dielectric substrate (e.g., DBC) used in most power packaging modules. Referring now to the drawings, and more particularly to FIGS. 2A through 5F, where similar reference characters denote corresponding features consistently throughout the figures, there are shown preferred embodiments.

According to the embodiments herein by stacking power devices, the power module is no longer constrained by the limitations of planar packaging; therefore, significant improvements can be made to the package. However, stacking devices creates a significant thermal challenge which must be addressed. The thermal challenge is addressed by incorporating the heat sink both above and below each of the stacked devices.

Generally, the embodiments herein comprise a power module which incorporates stacked power components and an integrated cooling system. An exemplary configuration provides for a half-bridge layout 30 shown in FIG. 2A with two diodes 31, 32 and two switching devices 33, 34 (e.g., IGBTs, MOSFETS, etc.). However, the embodiments herein can equally include other types of electronic components such as bypass capacitors, among others.

The basic unit cell of the packaging structure 40 is shown in FIG. 2B, with reference to FIG. 2A, and this structure 40 is the building block of all larger modules discussed below with respect to the embodiments herein. The structure 40 comprises five layers (Layers 1-5) which alternate and comprise electrically conductive material (Layers 1, 3, and 5) and devices (Layers 2 and 4). One aspect of the embodiments herein is that the electrically conductive layers act as electrical, thermal, and structural connections. This configuration also incorporates an integrated cooling system which can be passive air cooling, forced air convection, active liquid cooling, solid to liquid phase change materials, and/or boiling liquids depending on the application requirements.

The electrically conductive layers (Layers 1, 3, and 5) comprise copper that is plated with nickel and/or gold, although other electrically conductive materials can be used. In order to create the conductive layers (Layers 1, 3, and 5), a sheet of the electrically conductive material is machined, additively manufactured, and/or chemically etched to create pillars for connection to the devices (Layers 2 and 4). Pillars 37 are formed on both sides of Layer 3 but only on one side for layers 1 and 5. These pillars 37 are attached to the devices 31-34 by solder, conductive paste, or another mechanism that is both thermally and electrically conductive. The pillars 37 serve two purposes: (a) thermal connections to remove the heat from the devices 31-34 and (b) low stress interconnects to the devices 31-34. The pillars are not required for the structure to operate effectively and a solid metal electrical connection can also be used.

The base layer (Layer 1) acts as the positive bus 35 and connects the drain (D) of the switching device 33, 34 to the cathode of the associated diode 31, 32. On top of the base electrically conductive layer (Layer 1) are the devices (Layer 2): diode 31 and switching device 33. The next layer (Layer 3) comprises a substantially middle conductive layer 38 that acts as the midpoint on the circuit 30 (of FIG. 2A) and structure 40 (of FIG. 2B). The middle conductive layer 38 electrically connects the source (S) of the lower switching device 33 and the anode of the lower diode 31 to the anode of the upper diode 32 and the drain (D) of the upper switching device 34. Layer 4 comprises diode 32 and switching device 34. The final layer (Layer 5) acts as the negative bus 36 in the half-bridge configuration.

Figure 3B:
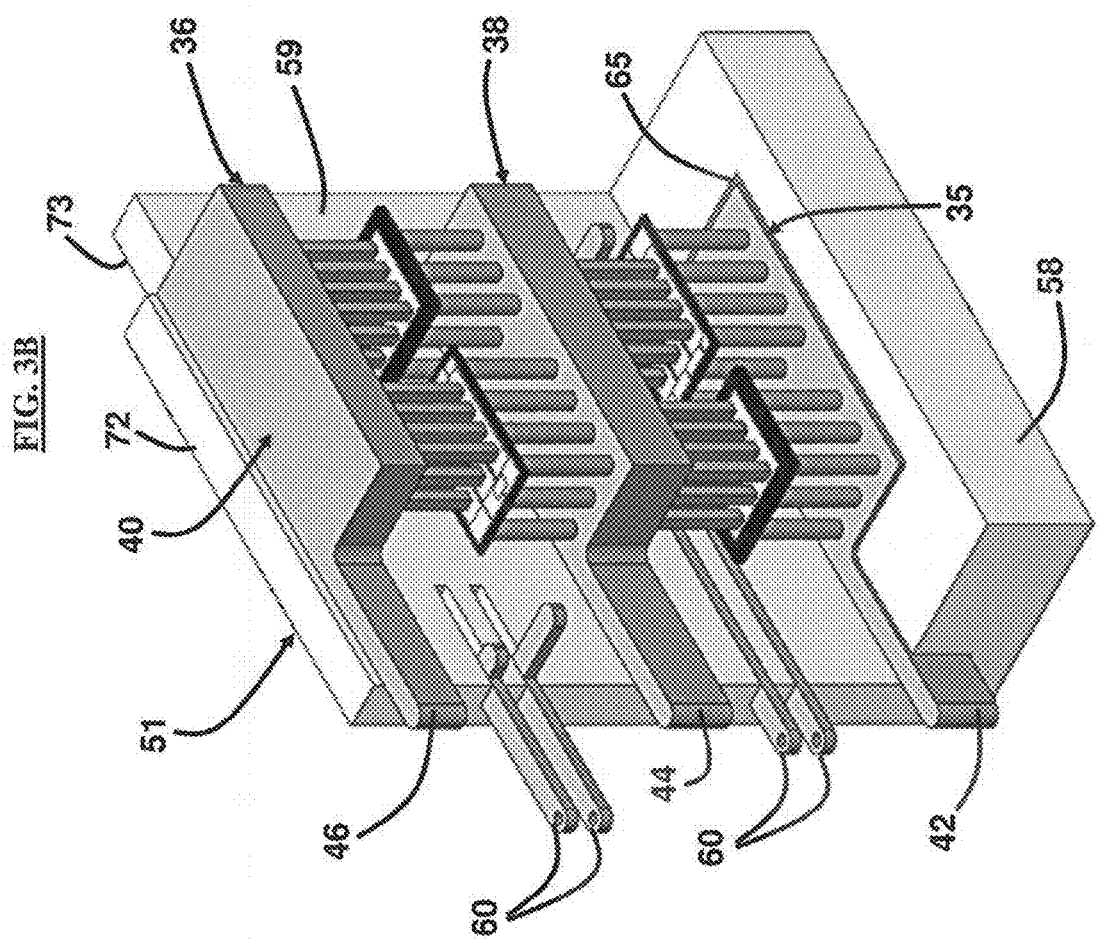
FIGS. 3B through 3E are various schematic diagrams of the power package module of FIG. 3A configured in a housing unit according to an embodiment herein.

FIGS. 3A through 3F, with reference to FIGS. 2A and 2B, illustrate a half-bridge configuration. FIG. 3A shows the four devices 31-34 with the metal pillars 37 attached to both the top and the bottom of the devices 31-34. The positive bus 35 may be configured as a busbar comprising a base portion 41 and an external electrical contact 42 extending from the base portion 41. The external electrical contact 42 creates a cut-out region 74 with respect to the base portion 41. The negative bus 36 may also be configured as a busbar comprising a base portion 45 and an electrical contact external electrical contact 46 extending from the base portion 45. The external electrical contact 46 creates a cut-out region 76 with respect to the base portion 45. The middle conductive layer 38 may be similarly configured as the positive bus 35 and the negative bus 36 such that the middle conductive layer 38 comprises a base portion 43 and an external electrical contact 44 extending from the base portion 43. The external electrical contact 44 creates a cut-out region 75 with respect to the base portion 43. The configurations of the external electrical contacts 42, 44, 46 may be embodied differently and in different configurations the cut-out regions 74, 75, 76 may not exist. Accordingly, FIGS. 3A through 3F show only one possible configuration, and the embodiments herein are not restricted to any particular configuration.

Figure 3C:
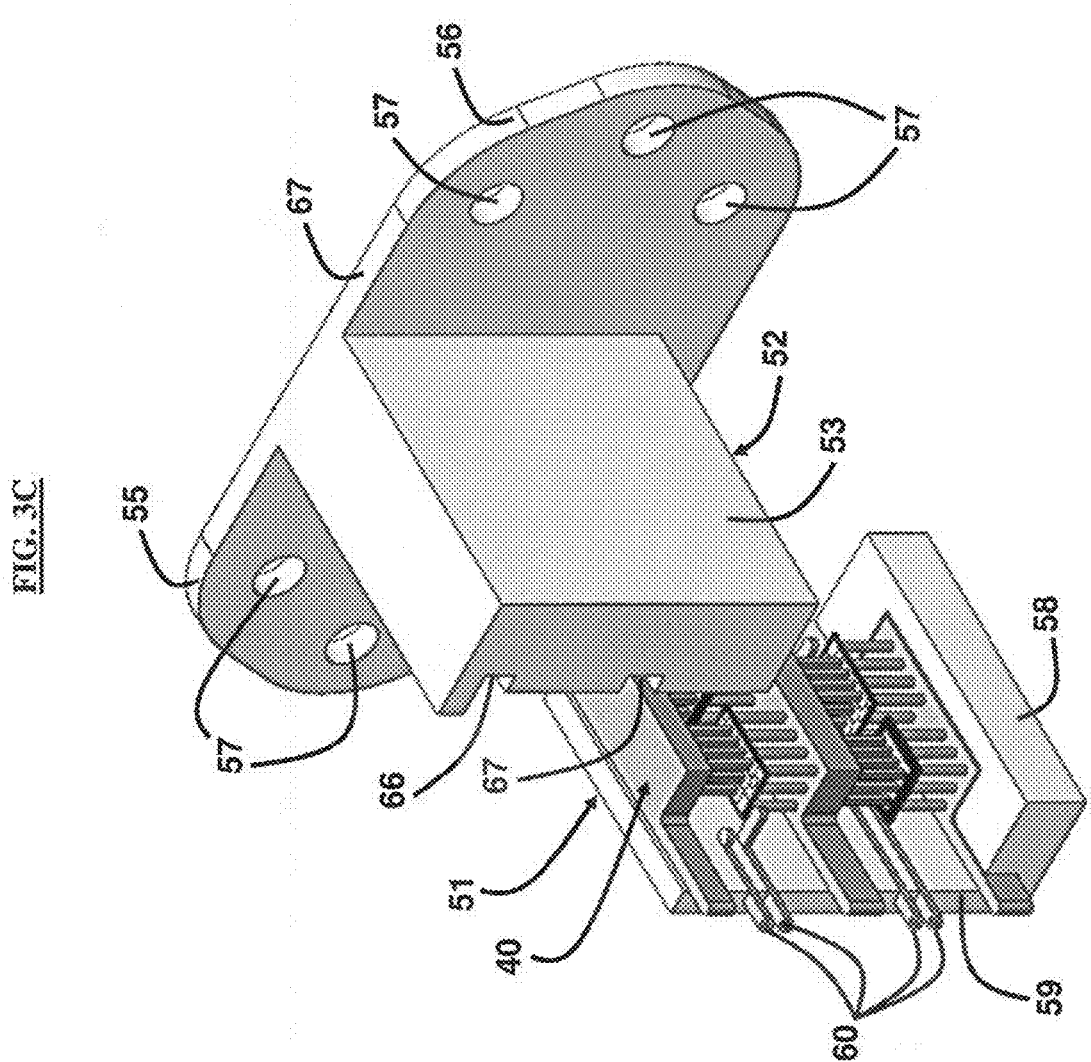
Figure 3D:
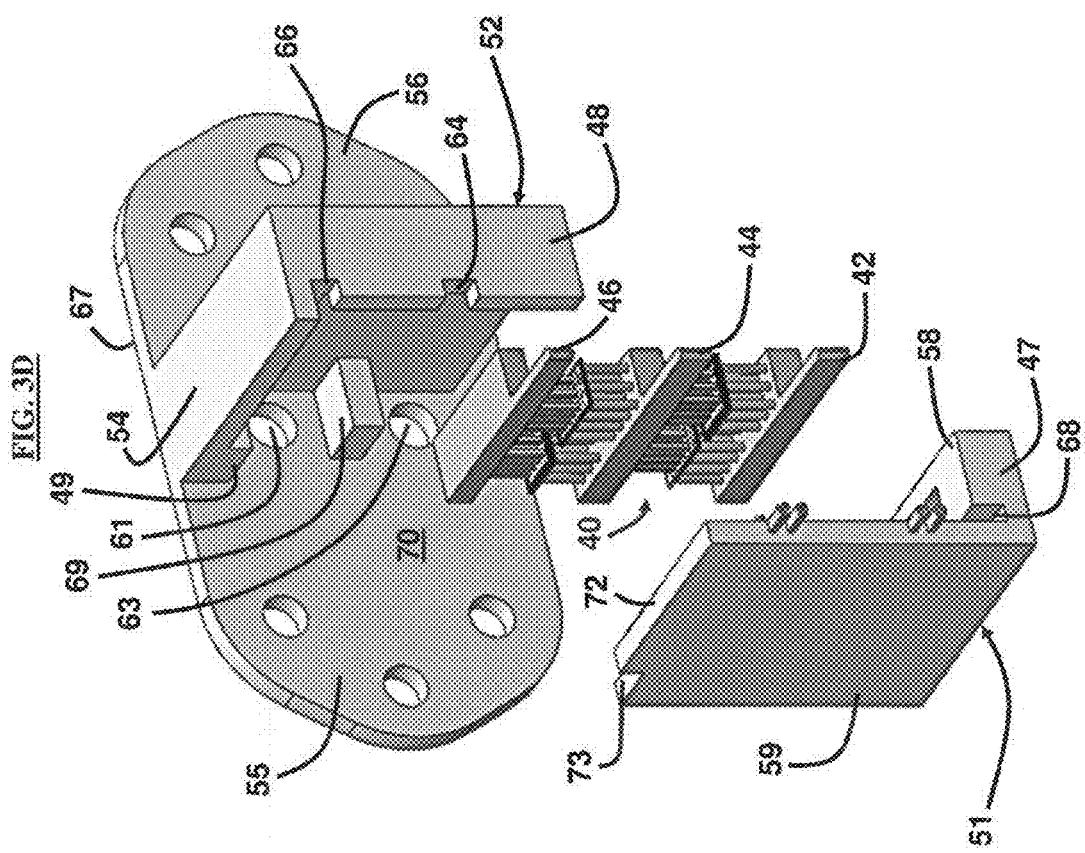
Figure 3E:
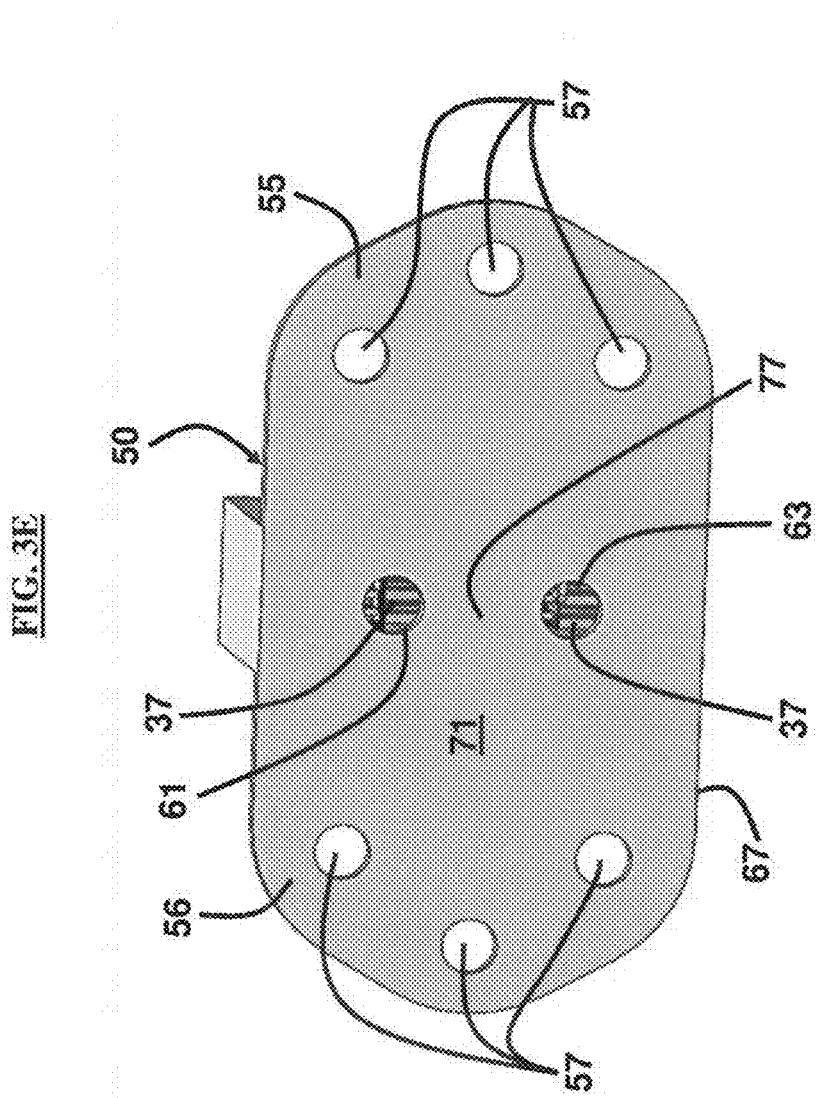

The module 40 is configured to be aligned into a housing 50 comprising a first component 51 and a second component 52 and can be made of any non-electrically conductive material that is fluidically sealed. FIG. 3B illustrates the module 40 positioned in the first component 51. FIG. 3C illustrates how the second component 52 is prepared for alignment with the first component 51 containing the module 40. FIG. 3D illustrates an exploded view of the module 40, first component 51, and second component 52. FIG. 3E illustrates the assembled housing 50. The housing 50 is generally configured to fluidically seal the component, provide electrical isolation, and create mechanical support. In an exemplary embodiment, the first component 51 comprises a base component 58 and a wall component 59 upwardly extending from the base component 58. The wall component 59 includes a top portion 72 with a cut-out portion 73 configured therein. The base component 58 is configured to hold the positive bus 35. The base component 58 comprises a pocket 65 configured in the base component 58, and a channel 68 connected to said pocket 65 and extending to an end 47 of the base component 58. The pocket 65 is dimensioned and configured to accommodate the base portion 41 of the positive bus 35, and the channel 68 is dimensioned and configured to accommodate the external electrical contact 42 of the positive bus 35. Furthermore, four additional electrical contacts 60 that are placed into the first component 51 are gate (G) and source (S) contacts for the switch device 33, 34.

In an exemplary embodiment, the second component 52 includes an end wall 48, a side wall 53, a top wall 54, and a plate component 67. The end wall 48 comprises a pair of cut-out regions 64, 66, which are dimensioned and configured to accommodate the external electrical contacts 44, 46 of the middle conductive layer 38 and negative bus 36, respectively. The side wall 53 comprises a substantially similar length and height as the wall component 59 of the first component 51 of the housing 50. The plate component 67 comprises an inner surface 70 and an outer surface 71. A first block component 49 is configured adjacent to both the top wall 54 and the inner surface 70 of the plate component 67. A second block component 69 is configured adjacent to the inner surface 70 of the plate component 67 and is further configured to be aligned with the first block component 49, yet spaced apart from the first block component 49. The plate component 67 is further configured with a pair of flanged ends 55, 56 comprising a plurality of holes 57 used to accommodate screws (not shown), as well as a fluidic inlet hole 61 and outlet hole 63 such that the inlet hole 61 is positioned in between the first block component 49 and the second block component 69, and with the outlet hole 63 positioned under the second block component 69. In the fully assembled configuration of the housing 50, as shown in FIG. 3E, the pillars 37 of the module 40 are shown through the inlet hole 61 and outlet hole 63, wherein the inlet hole 61 and outlet hole 63 are configured in a substantially central area 77 of the plate component 67. When the housing 50 is fully assembled around the module 40, the negative bus 36 of the module abuts the first block component 49, and the middle conductive layer 38 abuts the second block component 69 such that the external electrical contact 46 of the negative bus 36 aligns with and extends through the cut-out region 66 of the end wall 48 of the second component 52 of the housing 50 such that the cut-out region 75 is bounded by the external electrical contact 46 on one side, the end wall 48 on another side, and the side wall 53 on still another side thereby creating a portion of the cooling path (further shown in FIG. 4). Similarly, when the housing 50 is fully assembled around the module 40, the external electrical contact 44 of the middle conductive layer 38 aligns with and extends through the cut-out region 64 of the end wall 48 of the second component 52 of the housing 50. Furthermore, when the housing 50 is fully assembled around the module 40 the external electrical contact 42 of the positive bus 35 aligns with and extends through the channel 68 of the base component 58 of the first component 51 of the housing 50. Moreover, the top portion 72 of the wall component 59 of the first component 51 is configured to abut the top wall 54 of the second component 52 such that the cut-out portion 73 accommodates the first block component 49.

The integrated heat sink is another aspect of the module 40 provided by the embodiments herein. The challenge of stacking two power devices 31/33, 32/34 is the ability to get the heat out effectively. It is known in the industry that if two equally heat dissipating devices are placed on top of each other, then the device on the top will be significantly hotter than the one below it when the heat is removed through the bottom. This is especially challenging in power devices which are already extremely heat dissipative devices and often are already approaching their thermal limits in applications. Therefore, in order to effectively stack two power devices, the ability to effectively remove heat is critical. In addition, it is known that the removing heat from both the top and bottom of the device is preferred over the typical approach of only removing heat through the substrate (backside). However, topside cooling can allow additional heat removal paths and is something that the conventional approaches have not adequately accomplished.

The embodiments herein allow for both top and backside cooling with the heat sink directly in contact with the chip. FIGS. 3D and 3E illustrate the locations of the fluidic inlet hole 61 and outlet hole 63. FIG. 4, with reference to FIGS. 2A through 3E, shows the general path of the fluid through the power module 40. The fluid, which is a dielectric fluid, flows over both the bottom pillars 37a, 37b and top pillars 37c, 37d of each device 31/33, 32/34, respectively, cooling each device 31/33, 32/34 as the fluid passes. Alternatively, the fluid may comprise passive air cooling, forced air convection, active liquid cooling, and/or boiling liquids depending on the application requirements. Still alternatively, rather than a fluid, the cooling system may include solid to liquid phase change materials. The cooling path is not limited to just this configuration and varying cooling paths could be used in accordance with the embodiments herein. The initially cool fluid heats up as it progresses along the path denoted by the block arrows in FIG. 4.

The description above refers to a single half-bridge layout 30 with two diodes 31, 32 and two switching devices 33, 34. However, the embodiments herein can easily be expanded to accommodate any number of diodes, capacitors, switching devices, and other heat-producing electronic devices. Accordingly, while the half-bridge layout 30 is used because it is the building block for many power electronic converters such as inverters and DC-DC converters, this structure 30 can be easily expanded to build any number of full power modules and is both modular and scalable.

Figure 5C:
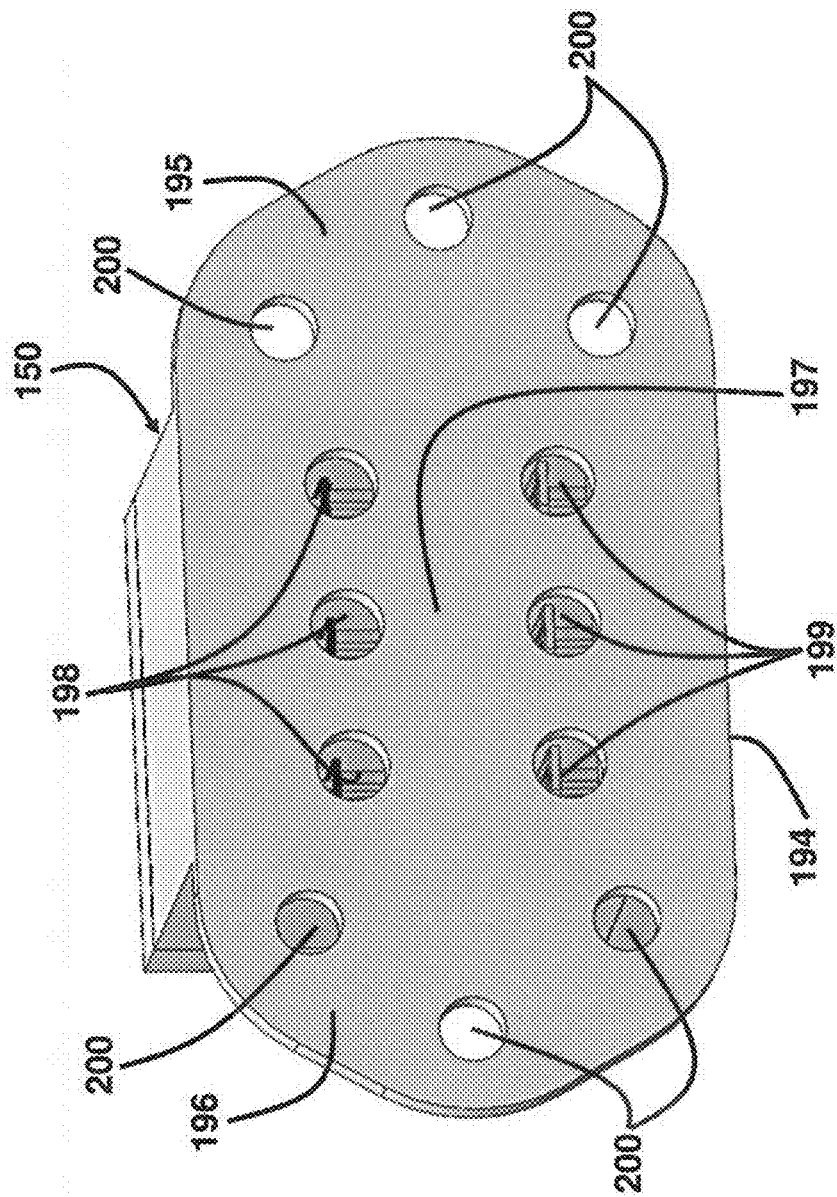
FIG. 5C is a schematic diagram of the power package module of FIG. 5A fully configured in a housing unit showing the locations of the fluidic connections according to an embodiment herein.

For example, FIGS. 5A through 5F, with reference to FIGS. 2A through 4, show how to expand the configuration by combining multiple modules 40a, 40b, 40c together in an expanded module 140 with a single positive bus 35a and single negative bus 36a. FIG. 5A shows how the modules 40a, 40b, 40c are electrically connected. The positive bus 35a may be configured as a busbar comprising a base portion 41a and a plurality of external electrical contacts 42a, 42b extending from the base portion 41a. The negative bus 36a may also be configured as a busbar comprising a base portion 45a and a plurality of external electrical contact 46a, 46b extending from the base portion 45a. The middle conductive layers 38a, 38b, 38c each comprise a base portion 43a, 43b, 43c, respectively, and an external electrical contact 44a, 44b, 44c extending from the base portion 43a, 43b, 43, respectively.

FIG. 5B illustrates the housing 150, which is configured with multiple components 151, 161, 171, 181, 191, being placed around the expanded module 140. Component 151 comprises an upper wall 152 from which a plurality of prongs 153, 154, 155 extend therefrom. A gap 156, 157 provides a separation between the prongs 153, 154, 155. Component 161 comprises a base portion 163 that provides a seat for the expanded module 140. Component 161 further includes a side wall 164 extending from said base portion 163, wherein the side wall 164 comprises a plurality of electrical contacts 7 extending therefrom. Additionally, the base portion 163 comprises a pair of cut-out regions 165a, 165b, which are dimensioned and configured to accommodate the plurality of external electrical contacts 42a, 42b of the positive bus 35a once the expanded module 140 is seated in the base portion 163 of component 161.

Components 171, 181 each comprise wall members 172, 182, respectively comprising a plurality of electrical contacts 8, 9 extending therefrom, respectively. Component 191 comprises a pair of walls 192, 193 configured transverse to one another, and a plate component 194 connected to the pair of walls 192, 193. As shown in FIG. 5C, the plate component 194 comprises a pair of flanges 195, 196 comprising a plurality of holes 200 used to accommodate screws (not shown), as well as a fluidic inlet holes 198 and outlet holes 199 such the inlet holes 198 and outlet holes 199 are configured in a substantially central area 197 of the plate component 194. FIGS. 5D through 5F further illustrate the fully configured housing 150 containing the module 140.

The power modules 40, 140 provided by the embodiments herein significantly reduce the size (16× smaller), weight (8.6× reduction), and cost for power electronic thermal management compared with some conventional power modules while improving reliability and performance. Moreover, the reduction in inductance provided by the embodiments herein reduces the system size by no longer requiring a snubber and/or reducing the amount of passive components in the system.

While the embodiments herein are described with respect to power module technology, power modules are numerous and are used in any type of power conversion. Accordingly, the embodiments herein could be used in various types of diverse applications including hybrid and electric vehicles, UAVs, renewable energy systems (solar, wind, etc.), generators, aerospace, oil drilling, geothermal, etc. The embodiments herein could also be used in lower powered systems including cell phone, electronics chargers, computers, etc. The cooling requirements would be much less but the packaging approach can still be used. Moreover, due to the low stress inherent in the configurations provided by the embodiments herein, chips made out of different materials are also easily integrated.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A power module comprises:
   a stack of power electronic components arranged in layers;
   an electrically conductive material separating each layer from one another;
   a heat sink operatively connected to multiple sides of each power electronic component in said stack; and
   a cooling path integrated with each layer in said stack, wherein said cooling path accommodates a cooling fluid or a solid to liquid phase change material.

2. The power module of claim 1, wherein the power electronic components comprise a plurality of diodes.

3. The power module of claim 1, wherein the power electronic components comprise a plurality of switching devices.

4. The power module of claim 3, further comprising a housing unit that houses said power module, wherein said housing unit comprises a plurality of electrical contacts that operatively connect to said plurality of switching devices.

5. The power module of claim 1, further comprising electrically conductive layers positioned on opposite ends of said stack, wherein said electrically conductive layers comprise a first end electrically conductive layer and a second end electrically conductive layer.

6. The power module of claim 5, wherein said first end electrically conductive layer and said second end electrically conductive layer comprise copper.

7. The power module of claim 5, wherein said first side faces towards said first end electrically conductive layer, wherein said second side faces towards said second end electrically conductive layer, and wherein the first end and second end electrically conductive layers comprise busbars.

8. The power module of claim 1, wherein said each power electronic component comprises a first side and an oppositely positioned second side.

9. The power module of claim 8, wherein said heat sink comprises at least one pillar structure extending from each of said first side and said second side of said each power electronic component.

10. The power module of claim 1, further comprising a housing unit that houses said power module.

11. The power module of claim 10, wherein said housing unit comprises a plurality of holes aligned with said cooling path to create an inlet and outlet for the cooling fluid or the solid to liquid phase change material to traverse along said cooling path.

12. The power module of claim 1, wherein said electrically conductive material is configured as a structured layer comprising a base portion and an external electrical contact extending from said base portion.

13. The power module of claim 1, further comprising multiple power modules adjacent to one another.

14. The power module of claim 1, wherein said stack of power electronic components arranged in layers comprises a half-bridge configuration.

15. The power module of claim 1 wherein said cooling fluid or said solid to liquid phase change material comes into direct contact with said power electronic components.

16. A power module comprising:
a plurality of power die layers comprising power electronic components;
a plurality of heat sink components operatively connected to multiple sides of each power electronic component;
a plurality of electrically conductive layers contacting said plurality of heat sink components, wherein a power die layer and an electrically conductive layer sequentially alternate to form a stacked structure such that both ends of said stacked structure comprises an end electrically conductive layer;
a cooling path integrated with each layer in said stacked structure; and
a housing unit that houses said stacked structure,
wherein said housing unit comprises a plurality of holes aligned with said cooling path to create an inlet and outlet for a cooling fluid to traverse along said cooling path.

17. The power module of claim 16, wherein said power electronic components comprise heat-producing electronic devices.

18. The power module of claim 16, wherein said cooling path accommodates a cooling fluid or a solid to liquid phase change material.

19. The power module of claim 18, wherein said fluid comes into direct contact with said plurality of power die layers, said plurality of heat sink components, and said plurality of electrically conductive layers.

* * * * *